United States Patent
Hoover et al.

(10) Patent No.: US 11,689,065 B2
(45) Date of Patent: Jun. 27, 2023

(54) SYSTEM AND METHODS FOR CHARGING A DEVICE

(71) Applicant: Honda Motor Co., Ltd., Tokyo (JP)

(72) Inventors: Andrew R. Hoover, West Liberty, OH (US); Hirokazu Kanahara, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 216 days.

(21) Appl. No.: 16/276,717

(22) Filed: Feb. 15, 2019

(65) Prior Publication Data

US 2020/0266651 A1  Aug. 20, 2020

(51) Int. Cl.
| | |
|---|---|
| H02J 7/00 | (2006.01) |
| H02J 7/14 | (2006.01) |
| H02J 50/80 | (2016.01) |
| G01R 19/165 | (2006.01) |
| H02J 50/12 | (2016.01) |
| H02J 50/10 | (2016.01) |
| H04B 5/00 | (2006.01) |

(52) U.S. Cl.
CPC ........ *H02J 50/80* (2016.02); *G01R 19/16528* (2013.01); *H02J 50/10* (2016.02); *H02J 50/12* (2016.02); *H02J 7/0044* (2013.01); *H02J 2310/40* (2020.01); *H04B 5/0037* (2013.01)

(58) Field of Classification Search
CPC ...... B60L 53/22; B60L 53/124; B60L 53/126; H02J 50/40; H02J 50/10; H02J 50/00; H02J 50/80; G01R 19/16528
See application file for complete search history.

(56) References Cited

U.S. PATENT DOCUMENTS

| | | | |
|---|---|---|---|
| 7,868,585 B2 | 1/2011 | Sarnowsky et al. | |
| 8,878,393 B2 | 11/2014 | Kirby et al. | |
| 9,356,659 B2 | 5/2016 | Partovi | |
| 9,601,943 B2 | 3/2017 | Partovi et al. | |
| 9,673,646 B1 * | 6/2017 | Cheng | B32B 27/38 |
| 9,728,980 B2 | 8/2017 | Jung et al. | |
| 9,735,836 B2 | 8/2017 | Van Wageningen et al. | |
| 9,802,504 B2 | 10/2017 | Jones et al. | |
| 9,876,379 B1 * | 1/2018 | Leabman | H02J 50/20 |
| 10,141,756 B1 * | 11/2018 | Venkatasamy | H02J 7/342 |
| 2003/0057776 A1 * | 3/2003 | Takase | H02J 7/1438 307/43 |

(Continued)

FOREIGN PATENT DOCUMENTS

| | | |
|---|---|---|
| JP | 2017209010 A | 11/2017 |
| JP | 2018011508 A | 1/2018 |

*Primary Examiner* — Alexis B Pacheco
(74) *Attorney, Agent, or Firm* — Armstrong Teasdale LLP

(57) ABSTRACT

Systems and methods for supplying power to an electronic device are provided. A first power limit is received from the electronic device at a transmitter. The transmitter input power is set to correspond to the first power limit. The transmitter supplies power corresponding to the transmitter input power to the electronic device to initiate charging, and an electrical value associated with the transmitter input power is monitored. During monitoring, the first electrical value is compared to a predefined second electrical value, the power supply to the receiver is discontinued based on the monitoring, and the transmitter input power is adjusted to correspond to a second power limit based on the comparison.

20 Claims, 3 Drawing Sheets

(56) References Cited

U.S. PATENT DOCUMENTS

| | | | |
|---|---|---|---|
| 2007/0075153 A1* | 4/2007 | Blanchard | H02J 5/005 237/12.3 A |
| 2008/0079388 A1* | 4/2008 | Sarnowsky | H02J 7/025 320/103 |
| 2009/0195214 A1* | 8/2009 | Gehrke | H02J 7/0068 320/137 |
| 2009/0308933 A1* | 12/2009 | Osada | H02J 50/10 235/492 |
| 2010/0171367 A1* | 7/2010 | Kitamura | H02J 50/12 307/104 |
| 2010/0264746 A1* | 10/2010 | Kazama | H04W 52/18 307/104 |
| 2011/0050164 A1* | 3/2011 | Partovi | H02J 7/00034 320/108 |
| 2011/0156638 A1* | 6/2011 | Thorsell | H02J 7/0044 320/108 |
| 2012/0091948 A1* | 4/2012 | Shinde | B60R 7/04 320/108 |
| 2012/0217658 A1* | 8/2012 | Kuroda | H01L 25/0657 257/777 |
| 2012/0235499 A1* | 9/2012 | Liu | H02J 7/025 307/104 |
| 2012/0299538 A1* | 11/2012 | Arai | H02J 50/10 320/108 |
| 2012/0306284 A1 | 12/2012 | Lee et al. | |
| 2013/0038280 A1* | 2/2013 | Boundy | H02J 7/0044 320/108 |
| 2013/0154373 A1* | 6/2013 | Lisuwandi | H02J 50/12 307/34 |
| 2013/0214732 A1* | 8/2013 | Nowottnick | G07C 9/00309 320/108 |
| 2013/0234656 A1* | 9/2013 | Lambert | H02J 7/0042 320/108 |
| 2013/0249682 A1* | 9/2013 | Van Wiemeersch | B60L 50/16 340/426.24 |
| 2013/0278208 A1* | 10/2013 | Rejman | H02J 50/10 320/108 |
| 2013/0285603 A1* | 10/2013 | Zeinstra | H02J 7/025 320/108 |
| 2013/0334879 A1* | 12/2013 | Ido | B60L 53/14 307/10.1 |
| 2014/0103865 A1* | 4/2014 | Van Wiemeersch | H02J 7/0047 320/108 |
| 2014/0176057 A1* | 6/2014 | Van Wiemeersch | H02J 50/12 320/108 |
| 2014/0203770 A1* | 7/2014 | Salter | H02J 7/025 320/108 |
| 2014/0233172 A1* | 8/2014 | Ryann | H01F 38/14 361/679.43 |
| 2014/0265555 A1* | 9/2014 | Hall | B60L 3/0046 307/9.1 |
| 2014/0292015 A1* | 10/2014 | Lambert | B60R 11/0241 296/37.8 |
| 2014/0293538 A1* | 10/2014 | Han | B60H 1/00271 361/690 |
| 2015/0137734 A1* | 5/2015 | Wojcik | G06K 7/01 320/103 |
| 2015/0137747 A1* | 5/2015 | Salter | B60N 3/14 320/108 |
| 2015/0229134 A1* | 8/2015 | Masaoka | H02J 50/80 307/104 |
| 2015/0229156 A1* | 8/2015 | Iwabuchi | H02J 7/025 320/108 |
| 2015/0229157 A1* | 8/2015 | Lin | H02J 50/40 320/108 |
| 2015/0270738 A1* | 9/2015 | Colja | H02J 50/10 307/104 |
| 2015/0270741 A1* | 9/2015 | Leabman | H02J 50/40 307/9.1 |
| 2015/0303743 A1* | 10/2015 | Yamada | H02J 50/20 307/149 |
| 2015/0380970 A1* | 12/2015 | Vu | H02J 7/0044 320/108 |
| 2016/0056661 A1* | 2/2016 | Tanaka | H02J 50/10 320/108 |
| 2016/0064959 A1* | 3/2016 | Jung | H02J 7/00 320/162 |
| 2016/0087485 A1* | 3/2016 | Maeda | H02J 7/025 455/573 |
| 2016/0118834 A1* | 4/2016 | Swope | H02J 7/00034 320/108 |
| 2016/0144726 A1* | 5/2016 | Yoshida | H02J 50/12 320/108 |
| 2016/0156216 A1* | 6/2016 | Nakao | H02J 50/10 320/108 |
| 2016/0204644 A1* | 7/2016 | Dukerschein | H02J 7/0047 320/108 |
| 2016/0211697 A1* | 7/2016 | Lambert | B60R 16/02 |
| 2016/0221441 A1* | 8/2016 | Hall | H02J 5/005 |
| 2016/0226312 A1* | 8/2016 | Suzuki | H02J 7/025 |
| 2016/0276865 A1* | 9/2016 | Pike | H02J 50/70 |
| 2016/0318407 A1* | 11/2016 | Borin | H02J 7/025 |
| 2016/0359373 A1* | 12/2016 | Nishikawa | H02J 50/12 |
| 2016/0380485 A1* | 12/2016 | Murayama | H02J 7/025 307/104 |
| 2017/0012473 A1* | 1/2017 | Nishikawa | H02J 50/10 |
| 2017/0018973 A1* | 1/2017 | Murayama | B60L 53/126 |
| 2017/0021763 A1* | 1/2017 | Melaragni | B60R 1/00 |
| 2017/0025887 A1* | 1/2017 | Hyun | H02J 7/00714 |
| 2017/0043675 A1* | 2/2017 | Jones | H02J 50/40 |
| 2017/0093191 A1* | 3/2017 | Arnold | H02J 7/0036 |
| 2017/0141584 A1 | 5/2017 | Devaul et al. | |
| 2017/0141624 A1 | 5/2017 | White, II | |
| 2017/0223637 A1* | 8/2017 | Wang | H02J 50/90 |
| 2017/0282718 A1 | 10/2017 | Malek et al. | |
| 2017/0302112 A1* | 10/2017 | Maniktala | H02J 50/40 |
| 2018/0048178 A1 | 2/2018 | Leabman | |
| 2018/0056887 A1* | 3/2018 | Salter | H02J 7/025 |
| 2018/0102666 A1* | 4/2018 | Margaritis | H02J 7/025 |
| 2018/0154866 A1* | 6/2018 | Sute | F02N 11/0807 |
| 2018/0159371 A1* | 6/2018 | Kim | H02J 50/10 |
| 2018/0219402 A1* | 8/2018 | Chen | H02J 7/025 |
| 2019/0013702 A1* | 1/2019 | Muratov | H02J 50/10 |
| 2019/0036369 A1* | 1/2019 | Grant | H02J 7/1461 |
| 2019/0100155 A1* | 4/2019 | Muiter | B60R 11/0241 |
| 2019/0123588 A1* | 4/2019 | Kim | H01F 27/40 |
| 2019/0184921 A1* | 6/2019 | Kageyama | H01M 50/20 |
| 2019/0283645 A1* | 9/2019 | Garcia Salgado | H02J 7/0044 |

* cited by examiner

SYSTEM AND METHODS FOR CHARGING A DEVICE

BACKGROUND OF THE INVENTION

The field of the invention relates generally to wireless charging for devices and more specifically, to systems and methods for use in limiting power drawn by a device during wireless charging.

At least some known charging systems enable wireless charging of a device. For example, at least some known charging systems implement the Qi standard in a charging pad that enables a compatible device to be wirelessly charged via resonant inductive coupling when the device is placed on top of the pad. Current versions of Qi protocol include the potential for transmitters to deliver up to 15 Watt power to enable quicker charging of devices that include receivers that can accept up to 15 Watts.

The effectiveness of resonant inductive coupling for wireless charging may be limited because an air core is used to transfer magnetic flux, rather than an iron core as is used in traditional electronic charging devices, such as transformers. Moreover, in wireless charging systems, charging and/or energy transfer efficiency decreases as a transmitter and a receiver are moved farther apart from one another. Because of power transfer, transmitter, and receiver inefficiencies in wireless charging, much of the power transmitted by the transmitter does not make it to the receiver. Therefore, the transmitter input power in wireless charging systems must often be higher than the input power used in traditional wired charging systems. For example, because of inefficiencies in wireless charging systems, 43 Watt power may be needed at the transmitter in order to deliver 15 Watt power to the device battery. This is not a concern when a wireless power transmitter is plugged into a wall outlet in a home, since typically a wall outlet can provide more than enough current to transmit 43 Watt power.

However, there are limitations on the power available in a vehicle for wirelessly charging a device. At least some known vehicles include outlets, such as accessory outlets or USB outlets, that enable electronic devices, such as cellphones, to be charged in the vehicle. In such charging systems, current available for charging can vary depending on whether other devices in the vehicle are also drawing power. Overall power available for use by vehicle systems, including charging outlets, is limited by the capacity of the battery and the battery charging system. Furthermore, the size and/or capacity of the battery is constrained by weight and fuel economy goals. If the voltage at the input of the wireless charging transmitter drops, in some situations, there may not be enough current available to maintain the power supplied to the transmitter. To enable devices to be charged quicker, at least some known charging systems initially negotiate with the device being charged to set the amount of power transmitted to the device to the highest power that can be transmitted and received. However, those same known charging systems do not allow the transmitter to decrease the power being supplied to the device after the initial negotiation. Currently, when the power requested from the device exceeds the power available from the vehicle, the transmitter will drop the connection to the receiver and stop charging until the voltage recovers. Once the voltage recovers, the receiver and transmitter will begin the negotiation process again. However, the transmitter may again agree to provide a higher power than the vehicle can sustain, leading to additional dropped charging connections.

BRIEF DESCRIPTION OF THE INVENTION

In one aspect, a method for supplying power to an electronic device is provided. The method includes receiving a first power limit from the electronic device at a transmitter, setting the transmitter input power to correspond to the first power limit, and transmitting power, corresponding to the transmitter input power, to the electronic device to initiate charging. A first electrical value is associated with the transmitter input power. The method further includes monitoring the first electrical value, comparing the first electrical value to a predefined second electrical value, discontinuing power supplied to the receiver based on the comparison, and adjusting the transmitter input power to correspond to a second power limit based on the comparison.

In another aspect, a wireless charging system for use with a device in a vehicle is provided. The charging system includes a processor and a transmitter coupled to the processor. The transmitter is configured to receive a first power limit from the device to be charged, and set the transmitter input power to correspond to the first power limit, wherein a first electrical value is associated with the transmitter input power. In addition, the transmitter is further configured to transmit power corresponding to the transmitter input power from the vehicle to the device, monitor the first electrical value, discontinue power supply to the device based on the monitoring, and adjust the transmitter input power to a second power limit based on the value of the monitored first electrical value.

In a further aspect, a method for charging an electronic device in a vehicle is provided. The method includes supplying power from a transmitter to the electronic device to initiate charging, monitoring the input power to the transmitter, comparing the input power to a predefined value, and adjusting the input power to the transmitter based on the comparison, such that the power supplied to the device is changed.

DETAILED DESCRIPTION OF THE INVENTION

Embodiments of the present disclosure relate to methods and systems for use in wirelessly charging a device. In some embodiments, the charging system is coupled within a vehicle. For example, in some embodiments, the wireless charging system includes a pad as a transmitter to which an electronic device can be mounted on to or set upon to facilitate convenient charging of the device without the use of a charging cable. The embodiments described herein are exemplary and are not limited to the descriptions provided. For example, although the disclosure is described in conjunction with vehicles, the systems and methods described herein can be used in any environment where wireless charging is available.

Figure 1:
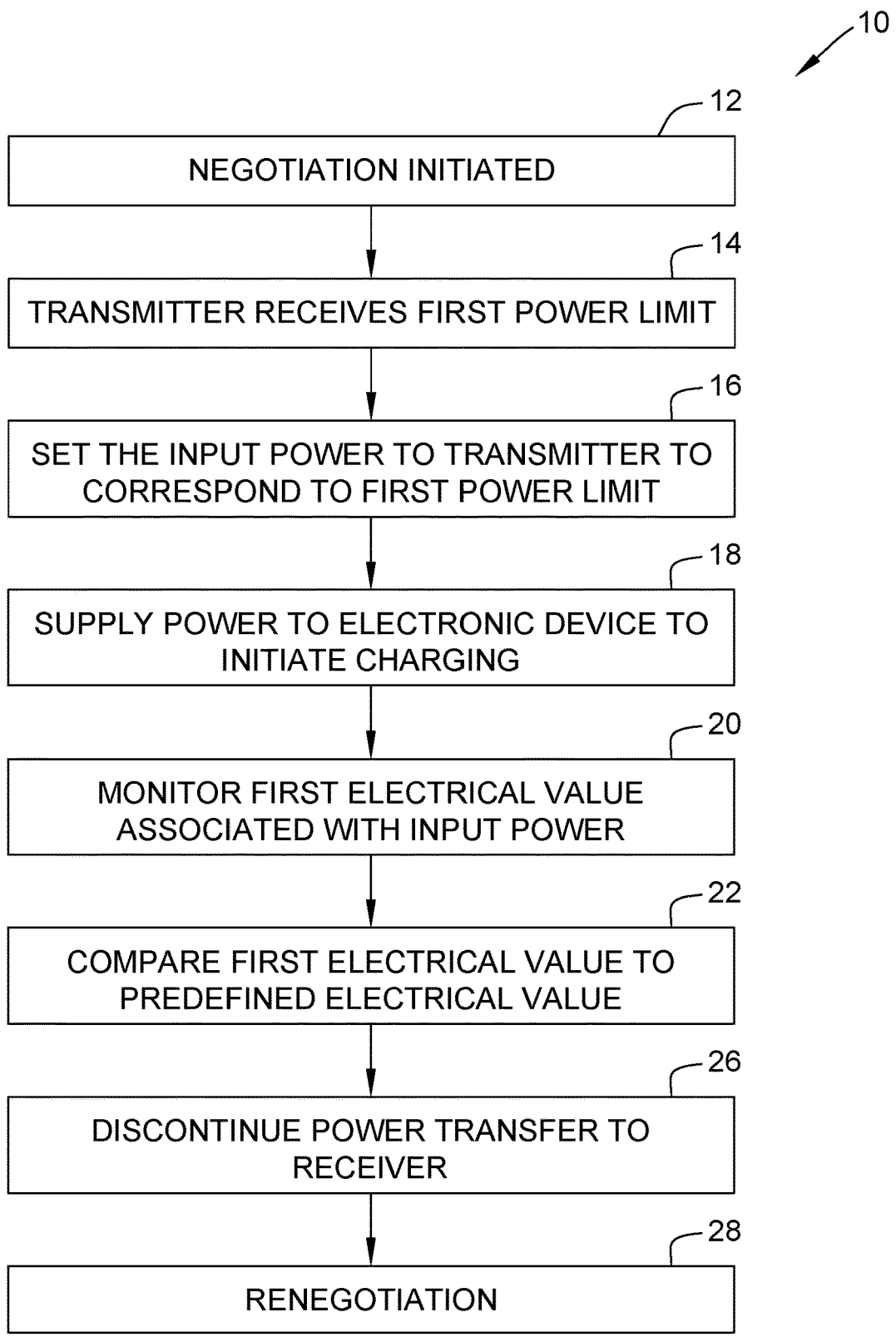
FIG. 1 is a flow chart of an exemplary method that may be used to supply power for charging a device wirelessly.

FIG. 1 is a flow chart of an exemplary method 10 that may be used to supply power for wirelessly charging a device, such as, but not limited to a cellular phone. In other embodiments, method 10 may be used to wirelessly charge any other device that is capable of receiving charging power wirelessly, including, but not limited to, a wristwatch, a tablet computer, a laptop computer, an electric vehicle, electronic accessories, such as audio accessories (e.g., headphones, earbuds, etc.), a computer mouse, a trackpad, a stylus device, and/or any other electronic equipment, including battery cases, battery packs, and/or supplemental batteries. Initially, after the device is positioned to be charged, a negotiation or start-up process is initiated 12 between the device and a wireless charging system.

During the initial negotiation, a receiver in the electronic device transmits communication packets to the transmitter that include the signal strength, identification, and a configuration to a transmitter included in the wireless charging system. After the receiver and transmitter establish that the two are compatible based on the communication packets and a compatibility signal is transmitted between the transmitter and the electronic device, the transmitter receives 14 a first receiver power limit from the electronic device. The first receiver power limit is also known as the initial power transfer limit and is defined as the highest charging power level in Watts that the electronic device is able to receive. The negotiation includes determining a first charging power, which is a power level that the transmitter is able to deliver and the receiver is able to receive. For example, the transmitter may determine the first charging power based at least partially on the first receiver power limit and a first transmitter power limit (i.e., the maximum power the transmitter is able to deliver). The first charging power is generally the lowest of either the first receiver power limit, and/or the first transmitter power limit.

After the first power limit is received 14 by the transmitter, the transmitter sets 16 its output power to the negotiated first charging power. Specifically, the transmitter adjusts its operating points to set 16 the input power received from a power source, such as, but not limited to, a vehicle's battery, at values that enable the transmitter to deliver enough power for the receiver to obtain power up to the first charging power. The transmitter operating points may include a transmitter input voltage and/or a transmitter input current. These operating points control the power received by the transmitter (i.e., a transmitter input power), and therefore the transmitter output power. Due to inefficiencies inherent in wireless charging such as transmitter inefficiency, power transfer inefficiency, and receiver inefficiency, power output by the transmitter needs to be higher than the first charging power to generate enough power at the receiver to match the first charging power. The transmitter can then supply 18 power, corresponding to the transmitter input power, wirelessly to the receiver in the electronic device to initiate charging.

After the negotiation process is complete and a battery in the electronic device is charging, the wireless charging system monitors 20 the current drawn by the transmitter. More specifically, the charging system monitors a first electrical value associated with the input power drawn by the transmitter from the power source. The monitoring 20 may be, but is not limited to, continuous or periodic monitoring. In other embodiments, the first electrical value can be, but is not limited to, an amperage value, a voltage value, a resistance value, or a power value. For example, in some embodiments, a vehicle's battery voltage level is monitored to provide a driver of the vehicle a battery charge level gauge and to provide voltage level signals for use by the wireless charging system. In each embodiment, the first electrical value being monitored 20 is compared 22 to a second predefined electrical value. The second predefined electrical value can be, but is not limited to being, a predefined value of a threshold battery level, a stored table of threshold battery levels, a threshold range of desired battery levels, or a sliding scale of threshold battery levels to be adapted to a wide variety of applications, such as vehicles with different batteries. The battery levels monitored may be voltage, amperage, and/or power levels.

In an exemplary embodiment, the first electrical value and the second predefined electrical value are amperage values. The current drawn by the transmitter is monitored 20 and compared 22 to the second predefined electrical value to determine if the first electrical value is greater than the second predefined electrical value. In another embodiment, the first electrical value and the second predefined electrical value are voltage values. The voltage at the transmitter input is monitored 20 and compared 22 to the second predefined electrical value to determine if the first electrical value is less than the second predefined electrical value. In yet a further embodiment, the current and voltage are both monitored 20 concurrently.

In another embodiment, hysteresis may be implemented to facilitate a more accurate comparison 22 and to ensure that the threshold value has been persistently crossed when the first electrical value is compared 22 to the second predefined electrical value. The implementation of hysteresis enables the wireless charging system to continue to operate and charge the device while the input power is adjusted 26 in response to the comparison 22. Moreover, hysteresis also facilitates accurately ignoring power flickering, power fluctuations, random voltage spikes, power surges, and all other undesired electrical noise, during the adjusting 26.

In some embodiments, to facilitate a more accurate determination of whether the threshold has been crossed, in addition to, or in the alternative to hysteresis, method 10 also includes waiting a predetermined amount of time between subsequent comparisons 22 to ensure that each comparison 22 is indicative of the first electrical value persistently crossing the threshold value and/or receiving the first electrical value directly from the vehicle, such as via a bus controller area network (BCAN) connector. In other embodiments, method 10 also includes in addition, or in the alternative, establishing a threshold range for changes in the first electrical value saved in the memory, or performing an additional comparison 22 by the microprocessor 33 between previously saved first electrical values in the memory and the electrical values being monitored. Generally, each of these embodiments facilitates decreasing electrical sensitivity of the wireless charging system.

In the exemplary embodiment, after a threshold value has been persistently crossed by the first electrical value, based on the comparison 22 to the second predefined electrical value, the wireless charging system discontinues 26 power transfer from the transmitter to the receiver. This is a proactive dropping of the charging connection between the transmitter and the receiver, rather than allowing the power requested from the device to exceed the power available from the vehicle. Discontinuing 26 power transfer, while the electronic device remains positioned on the wireless charging pad, causes the receiver to retransmit communication packets verifying the identification and configuration, a process referred to herein as "renegotiation" 28. During renegotiation 28, the power level available to be supplied 18 to the receiver can be renegotiated to a second charging power, for example.

In one embodiment, the charging system determines the second charging power based at least partially on a second transmitter power limit, which is lower than the first transmitter power limit. Once the renegotiated second charging power has been determined and the second transmitter input power has been set, wireless charging can resume. By renegotiating based on a lower transmitter power limit after the first electrical value has exceeded the threshold value, the charging system is more likely to be able to maintain consistent charging of the device (i.e., subsequent drops of the charging connection are less likely). Furthermore, after the vehicle is restarted, for example, a subsequent drive, vehicle conditions may be different and the vehicle may be able to supply a device with a higher power. Each drive, a new first negotiation will occur, and if necessary, the above described renegotiation with the lower transmitter power limit.

In a specific embodiment, where example values are included for illustrative purposes only and not to limit the description to such values, during negotiation, the charging system may determine the first charging power to be 15 W. More specifically, the receiver may transmit a signal to the transmitter corresponding to a desire to receive 15 Watts and the transmitter is able to deliver enough power for the receiver to obtain 15 Watts. In order for the receiver to obtain 15 Watts, the charging system sets the transmitter input power to 43 Watts. More specifically, if 12 Volts is available at the transmitter input, the charging system adjusts 16 the input current drawn by the transmitter to approximately 3.6 Amps. These operating points enable the transmitter to deliver enough power for the receiver to obtain power up to the first charging power.

However, subsequent to negotiation of the first charging power, the voltage available at the transmitter input may drop due to other electricity being used in the vehicle. For example, when an auto engine idle stop is activated, and/or when the engine is restarted after the auto engine idle stop, the voltage available to the transmitter may be significantly reduced. For example, if the voltage at the transmitter input drops to 9 Volts, the transmitter would need to draw 4.8 Amps to maintain the 15 Watt charge. The vehicle electrical system was able to provide 3.6 Amps, however, it may not be able to provide 4.8 Amps. In this example, the predefined second electrical value may be 4 Amps, and once the monitored transmitter input current exceeds 4 Amps, the charging system may discontinue 26 (e.g., turn off the transmitter) transferring power to the receiver. Alternatively, or in combination with the current monitoring, the predefined second electrical value may be 10 Volts, and once the monitored transmitter input voltage is lower than 10 Volts, the charging system may discontinue 26 transferring power to the receiver.

In the examples described above, the renegotiation 28 is initiated by discontinuing 26 transferring power to the receiver. In another embodiment, the renegotiation 28 is dynamic and wireless charging remains active and continuous during renegotiation 28. More specifically, in such an embodiment, the electronic device continues to charge, i.e., power is continued to be supplied 18 to the electronic device, while adjustments 26 to the input power to the transmitter are made. In such an embodiment, the charging system can initiate renegotiation 28 with the receiver without knowledge of the end user of the electronic device. In a further alternative embodiment, during renegotiation 28, the transmitter can determine whether to continue to transmit signals to the device receiver to charge the device or to discontinue charging. In some embodiments, the predefined second electrical value can be a value, or a table of values, stored in the memory and may be chosen and implemented accordingly by the transmitter. This may be dependent on the difference between the first and predefined second electrical values determined during comparison 22. Generally, the larger the difference determined during comparison 22, the more the input power to the transmitter may need to be adjusted 26.

During normal operations, the first electrical value is monitored 20, the value is compared 22 to the predefined second electrical value, and the input power to the transmitter is adjusted 26. More specifically, in the exemplary embodiment, during normal operations two feedback control loops are used. Alternatively more than two feedback control loops may be used. For example, a first control loop may be defined between the transmitter of the wireless charging system and the receiver of the electronic device, and a second control loop may be defined between the transmitter and a power source. As such, during normal operations the power source, i.e., the vehicle battery, supplies input power to the transmitter, and the transmitter supplies 18 power corresponding to the transmitter input power to the device to charge the electronic device.

As input power is supplied to the transmitter and power subsequently transmitted to the receiver, the wireless charging system also monitors 20 the first electrical value associated with the input power being supplied 18 to the transmitter. Monitoring 20 of the battery source by the charging system enables the input power received from the battery source to be compared 22 to the predetermined second electrical value. The predetermined second electrical value is a threshold value used for the comparison. If the input power to the transmitter changes and persistently crosses the threshold value set by the predetermined second electrical value, then the power transfer to the receiver is discontinued 26 prior to renegotiation 28 being initiated.

In an alternative embodiment, if the input power to the transmitter changes and persistently crosses the threshold value set by the predetermined second electrical value, the transmitter will continue to supply 18 power to the receiver and will additionally transmit to the receiver at least one signal that renegotiation 28 is necessary. The receiver prompts the transmitter to start renegotiation 28 and the input power being supplied 18 by the battery source to the transmitter is adjusted 26. As the power supplied 18 by the battery source is adjusted 26, the transmitter dynamically adjusts the power transmitted to the receiver.

In some embodiments, the feedback loops may be used to adjust 26 the input power supplied to the transmitter depending on the state of the battery source and demands of other electrical devices connected to the battery source during normal operations. The feedback control loops continue to execute renegotiation 28 during normal operations as many times as needed without user input to manage power demands safely and to efficiently continue wirelessly charging the electronic device.

Figure 2:
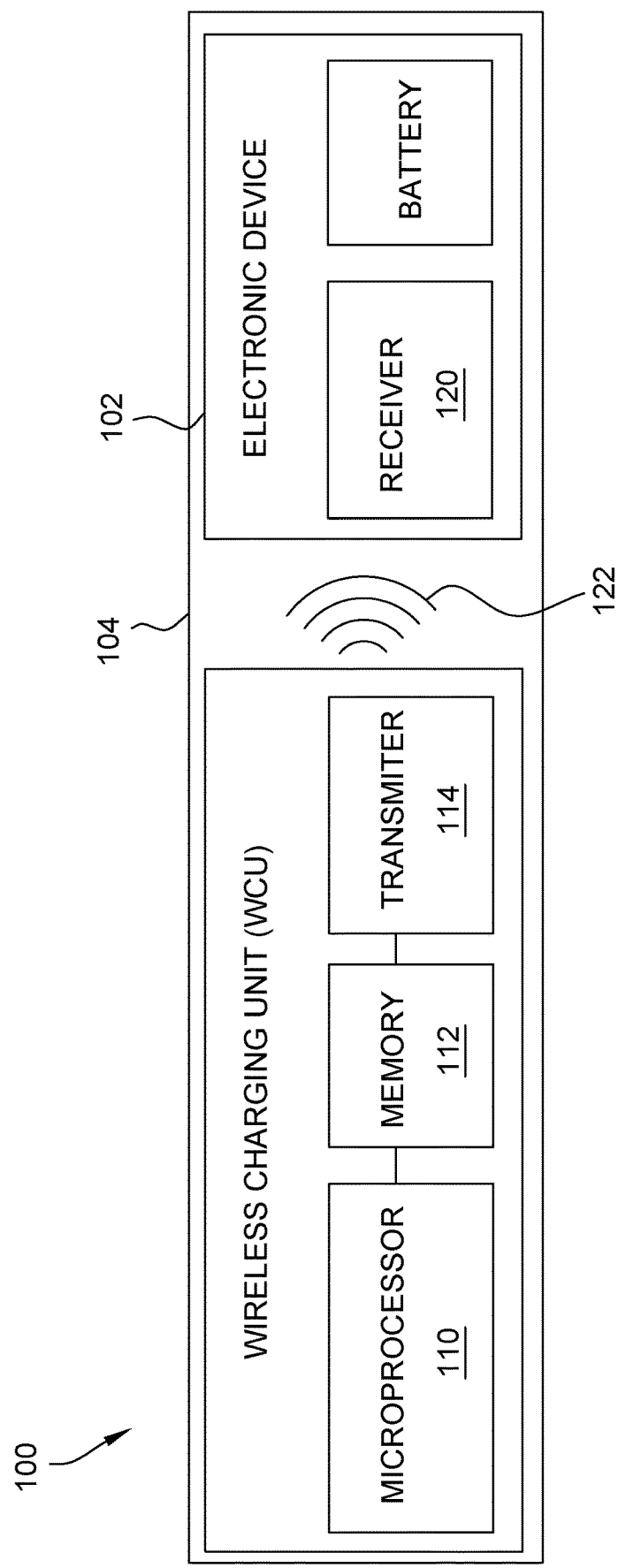
FIG. 2 is a schematic view of an exemplary charging system that may be used in a vehicle to charge a device wirelessly using the method shown in FIG. 1.
Figure 3:
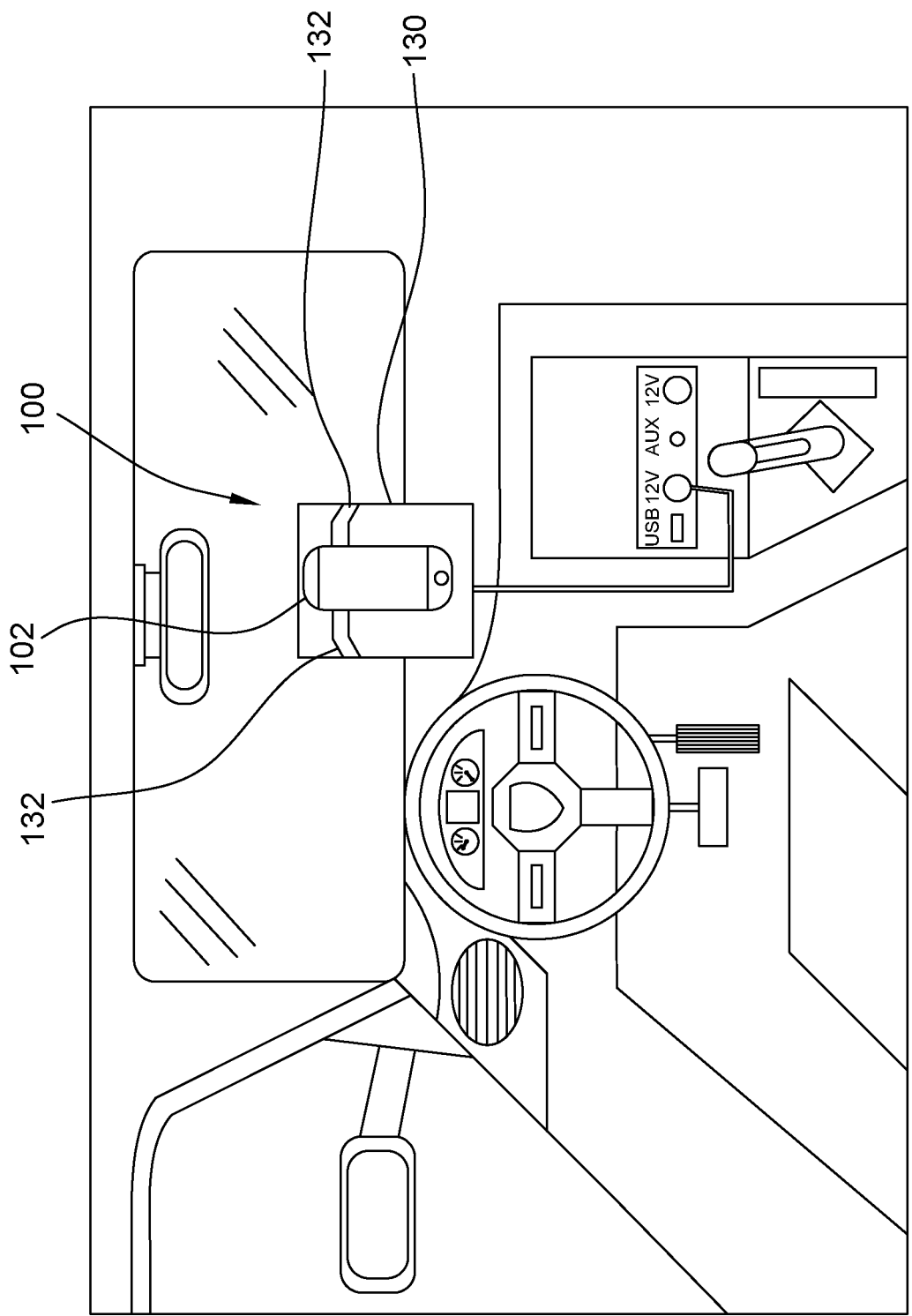
FIG. 3 is a perspective view of the charging system shown in FIG. 2 and within a vehicle.

FIG. 2 is a schematic view of an exemplary wireless charging system or unit 100 (also known as a WCU) that may be used to wirelessly charge an electronic device 102 in a vehicle 104. FIG. 3 is a perspective view of charging system 100 within vehicle 104. Although FIGS. 2 and 3 illustrate wireless charging system 100 being within vehicle 104, system 100 is not limited to only being used in a vehicle 104, but rather, system 100 may be used in a variety of other applications to wirelessly charge an electronic device 102 as described herein. In the exemplary embodiment, charging system 100 receives power from a 12V vehicle battery (not shown). More generally, charging system 100 is coupled to and receives power from a vehicle electrical system, which includes for example, the vehicle battery, an alternator, and other circuitry and/or devices that store and produce electricity for use by vehicle 104. In one embodiment, charging system 100 is integrated within the vehicle and is coupled to a bus controller area network (BCAN), for example. In another embodiment, the wireless charging system 100 is plugged into a power outlet within vehicle 104.

In one embodiment, charging system 100 includes an interface surface, sometimes referred to as a charging pad 130, sized to receive and electrically couple to electronic device 102 for wireless charging. Moreover, in an alternative embodiment, the device 102 may be charged while in a generally upright position.

In the exemplary embodiment, charging system 100 includes a microprocessor 110, a memory 112, and a transmitter 114. Microprocessor 110 is in communication with memory 112 and transmitter 114. The transmitter input power drawn from the vehicle is set to correspond to the negotiated first charging power and is then supplied to transmitter 114. The receiver 120 receives power from the generated electromagnetic field 122 and converts it back to electric current and charging of device battery 124 initiates.

Microprocessor 110 monitors the first electrical value associated with the input power to transmitter 114. In some embodiments, car battery levels can be monitored by microprocessor 110, such as via the BCAN. As such, the first electrical value associated with the input power can be monitored continuously by transmitter 114. Microprocessor 110 compares the first electrical value to a threshold predefined second electrical value, or to a table of values stored in memory 112. The value of the predefined second electrical value can be changed depending on the application of charging system 100. For example, in some embodiments, memory 112 can store a table of maximum transmitter input powers, which can be associated with each possible vehicle battery level. In another example, memory 112 can store a table of maximum amperage available for use by the charging system 100, for each possible vehicle battery level.

Microprocessor 110 in combination with memory 112 can be configured to implement hysteresis, wherein microprocessor 110 ensures the threshold value has been persistently crossed after comparing the first electrical value to the second electrical value. Memory 112 stores the first electrical value, or range of values as monitored data is transmitted to memory 112 by transmitter 114. This storage can be periodically updated from transmitter 114. Memory 112 communicates the first electrical value to microprocessor 110. In the exemplary embodiment, the first electrical value monitored is substantially unaffected by power flickering, power fluctuations, random voltage spikes, power surges, and all other undesired electrical noise. Implementing hysteresis facilitates ensuring that the threshold value is persistently crossed by the first electrical value as compared to the second electrical value. As such, a determination that the first electrical value has persistently crossed the threshold value is not the result of random electrical activity. Moreover, as such, a determination that first electrical value has persistently crossed the threshold value via hysteresis is only reached when the amount of power available from the vehicle 104 changes.

It should be noted that the wireless charging system described and illustrated herein is exemplary only. In some embodiments, the wireless charging system may be a stand-alone power adapter, such as a wireless charging mat that includes power adapter circuitry. Alternatively, the wireless charging system may be a wireless charging pad that is coupled to a power adapter or other equipment via a power cable, or may be a portable device. In further embodiments, charging system may be integrated into furniture, an interior component of a vehicle, and/or other systems or power transfer equipment. In some embodiments, the wireless charging system may be coupled to a wall outlet to operate with alternating current, may have a battery for supplying power, and/or may have another source of power. Moreover, the wireless charging system may include an AC-DC power converter for use in converting AC power source into DC power.

Exemplary embodiments of wireless charging methods and systems, and more specifically, limiting input power to an electronic device are described above in detail. Although the systems and methods are herein described and illustrated in association with a vehicle, the invention is also intended for use on other systems running on battery power. Moreover, it should also be noted that the components of the invention are not limited to the specific embodiments described herein, but rather, aspects of each component may be utilized independently and separately from other components and methods of limiting power described herein.

Moreover, although described herein with respect to a wireless charging system, the embodiments described above may also be applied to power delivery via a charging cable. For example, transmitter 114 may include a Universal Serial Bus (USB) charging port and receiver 120 may include a corresponding charging port in the device 102 (e.g., a Lightning® connector, USB Type-C connector). Device 102 may be electrically coupled to the USB charging port via the charging cable. Although charging device 102 using a charging cable is more efficient than wireless charging (e.g., less transmission losses), the USB power delivery specifications are continuing to increase the amount of power devices are able to receive via USB charging. For example, USB PD specifications presently allow for a maximum current of 5 Amps and potential power of up to 100 Watts. After charging of the device has commenced at a first charging power negotiated between the transmitter 114 and the receiver 120, and a threshold value has been persistently crossed by a monitored first electrical value, the transmitter 114 will discontinue power transfer to the receiver 120 and a renegotiation of the charging power will begin. As described above, the renegotiation will be based at least partially on a lower transmitter power limit.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A method for supplying power to an electronic device, said method comprising:
   receiving, at a transmitter, a first receiver power limit from the electronic device;
   determining a first charging power based at least partially on the first receiver power limit and a first transmitter power limit;
   setting a transmitter input power, received from a power source, to correspond to at least the determined first charging power, wherein a first electrical value is associated with the transmitter input power;
   transmitting power, corresponding to the determined first charging power, from the transmitter to the electronic device to initiate charging;
   transmitting power, from the power source, to at least one other electronic component;
   monitoring the first electrical value;
   comparing the first electrical value to a predefined second electrical value, wherein the predefined second electrical value is associated with a threshold level of the power source;
   determining a second charging power based at least partially on the first receiver power limit, the comparison of the monitored first electrical value to the predefined second electrical value, and the threshold level of the power source and a second transmitter power limit, wherein the second transmitter power limit is lower than the first transmitter power limit;
   adjusting the transmitter input power, received from the power source, to correspond to at least the determined second charging power; and
   transmitting power, corresponding to the determined second charging power, from the transmitter to the electronic device to continue charging.

2. The method in accordance with claim 1, wherein receiving a first power limit comprises establishing a compatibility signal between the transmitter and the electronic device.

3. The method in accordance with claim 2, wherein receiving a first power limit further comprises facilitating the electronic device to initiate charging the electronic device.

4. The method in accordance with claim 1, wherein the first electrical value and the predefined second electrical value comprise a first voltage value and a predefined second voltage value.

5. The method in accordance with claim 4, wherein adjusting the transmitter input power further comprises reducing the transmitter input power if the first voltage value is lower than the predefined second voltage value during the comparison.

6. The method in accordance with claim 1 wherein the first electrical value and the predefined second electrical value comprise a first amperage value and a predefined second amperage value.

7. The method in accordance with claim 6, wherein adjusting the transmitter input power further comprises reducing the transmitter input power if the first amperage value is greater than the predefined second amperage value during the comparison.

8. A wireless charging system for use in charging a device in a vehicle, the vehicle comprises a power source used to supply power to a transmitter and to at least one other component of the vehicle, said system comprising:
   a processor;
   the transmitter coupled in communication to said processor, said transmitter configured to:
      receive a first receiver power limit from the device to be charged;
      set a transmitter input power received from the power source of the vehicle to correspond to the first receiver power limit, wherein a first electrical value is associated with the transmitter input power;
      transmit power corresponding to the transmitter input power from the vehicle to the device;
      monitor the first electrical value;
      compare the first electrical value to a predefined second electrical value, wherein the predefined second electrical value is associated with a threshold level of the power source;
      determine a second power limit based at least partially on the first receiver power limit, the comparison of the monitored first electrical value to the predefined second electrical value, and the threshold level of the power source;
      adjust the transmitter input power to the second charging power limit; and
      transmit power corresponding to the adjusted transmitter input power from the vehicle to the device to continue charging.

9. The system in accordance with claim 8, wherein the transmitter and the device are configured to establish communication where compatibility is determined.

10. The system in accordance with claim 8, wherein the transmitter is configured to discontinue supplying power to the device and verify an identification and configuration of the device prior to adjusting of the transmitter input power.

11. The system in accordance with claim 8, wherein the value of the first and second electrical values are one of amperage values and voltage values.

12. The system in accordance with claim 8, wherein the transmitter is configured to compare the first electrical value to the predefined second electrical value using amperage, wherein the transmitter is further configured to adjust the transmitter input power if the first electrical value is greater than the predefined second electrical value during the comparison.

13. A method for charging an electronic device in a vehicle, said method comprising:
   supplying power from a transmitter to the electronic device to initiate charging, the transmitter having a first transmitter power limit;
   transmitting input power, from a power source, to the transmitter, the input power corresponding to the first transmitter power limit;
   transmitting power, from the power source, to at least one other electronic component of the vehicle;
   monitoring input power to the transmitter;
   comparing the input power to a predefined value, the predefined value associated with a threshold level of the power source;
   determine a second transmitter power limit based at least partially on the first transmitter power limit, a receiver power limit associated with the electronic device, the comparison of the monitored input power to the predefined value, and the threshold level of the power source; and
   adjusting the input power, from the power source, to the transmitter to correspond to the second transmitter power limit, such that the power supplied to the device, from the transmitter, is changed.

14. The method in accordance with claim 13, further comprising:
  establishing compatibility between the transmitter and the electronic device by coupling the device to be charged in communication with a charging system in the vehicle; and
  supplying power to the device based on the compatibility between the device and the transmitter.

15. The method in accordance with claim 14 wherein adjusting the input power further comprises reducing the input power based on the comparison.

16. The method in accordance with claim 14 wherein comparing the input power to a predefined value further comprises comparing a voltage value of the input power being monitored to a predefined voltage value.

17. The method in accordance with claim 16 wherein comparing a voltage value of the input power being monitored further comprises comparing the input power being monitored to a stored table of different amperage values.

18. The method in accordance with claim 14 wherein comparing the input power to a predefined value further comprises comparing an amperage value of the input power being monitored to a predefined amperage value.

19. The method in accordance with claim 18 wherein comparing a amperage value of the input power being monitored further comprises comparing the input power being monitored to a stored table of different amperage values.

20. The method in accordance with claim 14, wherein adjusting the input power to the transmitter based on the comparison further comprises continuously charging the electronic device while the input power to the transmitter is adjusted.

* * * * *